United States Patent
Tomonari et al.

(10) Patent No.: US 7,557,676 B2
(45) Date of Patent: Jul. 7, 2009

(54) SIGNAL TRANSMISSION CIRCUIT, ELECTRONIC DEVICE, CABLE, AND CONNECTOR

(75) Inventors: Toshio Tomonari, Tokyo (JP); Toshihiro Kuroshima, Tokyo (JP)

(73) Assignee: TDK Corporation, Tokyo (JP)

( * ) Notice: Subject to any disclaimer, the term of this patent is extended or adjusted under 35 U.S.C. 154(b) by 222 days.

(21) Appl. No.: 11/210,895

(22) Filed: Aug. 25, 2005

(65) Prior Publication Data

US 2006/0049894 A1    Mar. 9, 2006

(30) Foreign Application Priority Data

Sep. 7, 2004    (JP) ............................ P2004-260168

(51) Int. Cl.
- *H04B 3/28* (2006.01)
- *H03H 7/00* (2006.01)
- *H04M 9/00* (2006.01)

(52) U.S. Cl. .................. 333/181; 333/12; 379/412; 379/416

(58) Field of Classification Search ................. 333/175, 333/184, 185, 204, 12, 177, 181, 118, 119; 361/118, 119; 379/412, 416, 390.02, 392.01
See application file for complete search history.

(56) References Cited

U.S. PATENT DOCUMENTS

| | | | | |
|---|---|---|---|---|
| 4,888,675 A | * | 12/1989 | Kumar et al. ................. 363/47 |
| 5,083,101 A | * | 1/1992 | Frederick .................... 333/181 |
| 5,095,291 A | * | 3/1992 | Staschover et al. ............ 333/12 |
| 5,313,176 A | * | 5/1994 | Upadhyay ................... 333/181 |
| 5,587,692 A | * | 12/1996 | Graham et al. ................ 333/12 |
| 5,999,398 A | * | 12/1999 | Makl et al. ................... 361/302 |
| 6,127,903 A | * | 10/2000 | Foley .......................... 333/181 |
| 6,448,863 B1 | | 9/2002 | Ogawa et al. |
| 6,621,370 B1 | | 9/2003 | Dao |
| 6,694,013 B1 | | 2/2004 | Löfmark |
| 6,741,702 B2 | * | 5/2004 | Grimaud ................. 379/413.01 |
| 6,744,613 B2 | * | 6/2004 | McCook et al. ............. 361/111 |
| 6,781,481 B2 | * | 8/2004 | Richardson .................. 333/181 |
| 7,068,005 B2 | * | 6/2006 | Baker .......................... 318/611 |
| 2004/0127091 A1 | | 7/2004 | Naito et al. |

FOREIGN PATENT DOCUMENTS

| | | |
|---|---|---|
| EP | 1 434 318 A2 | 6/2004 |
| JP | A-64-046309 | 2/1989 |
| JP | A 02-135677 | 5/1990 |
| JP | A 11-68497 | 3/1999 |
| JP | A 2001-85118 | 3/2001 |

(Continued)

*Primary Examiner*—Robert Pascal
*Assistant Examiner*—Kimberly E Glenn
(74) *Attorney, Agent, or Firm*—Oliff & Berridge, PLC

(57) ABSTRACT

A signal transmission circuit has first to fourth inductors, and first and second varistors. The first and second inductors are magnetically coupled to each other. The first varistor is connected to ground and located posterior to the first inductor and is electrically connected to the first inductor. The third inductor is located between the first inductor and the first varistor and is electrically connected to the first inductor. The second varistor is connected to ground and located posterior to the second inductor and is electrically connected to the second inductor. The fourth inductor is located between the second inductor and the second varistor and is electrically connected to the second inductor.

18 Claims, 12 Drawing Sheets

FOREIGN PATENT DOCUMENTS

| JP | 2002353764 A * | 12/2002 |
| JP | A 2003-338722 | 11/2003 |
| JP | A 2004-40444 | 2/2004 |
| JP | A-2004-080436 | 3/2004 |
| JP | A-2004-235936 | 8/2004 |

* cited by examiner (a)

(b)

(a)

(b)

SIGNAL TRANSMISSION CIRCUIT, ELECTRONIC DEVICE, CABLE, AND CONNECTOR

BACKGROUND OF THE INVENTION

1. Field of the Invention

The present invention relates to a signal transmission circuit and to an electronic device, a cable, and a connector comprising the signal transmission circuit.

2. Related Background Art

The differential transmission system is one of systems for transmitting digital signals between electronic devices. The differential transmission system is a system of feeding mutually opposite digital signals on a pair of lines, and the differential transmission cancels out radiated noise from signal lines, and external noise. The cancellation of external noise results in decrease in noise, which permits transmission of signals in small amplitude. Furthermore, the signals in small amplitude offer an advantage of reduction in rise and fall times of signals, which implements increase in speed of signal transmission.

The interface standards using this differential transmission system include USB (Universal Serial Bus), IEEE1394, LVDS (Low Voltage Differential Signaling), DVI (Digital Video Interface), HDMI (High-Definition Multimedia Interface), and so on. Among these, HDMI is an interface enabling transmission of more digital signals, and high-speed interface enabling transmission of uncompressed digital signals between a source device (e.g., a DVD player, a set-top box, or the like) and a sink device (e.g., a digital television set, a projector, or the like). The HDMI permits high-speed transmission of video signals and sound signals through a single cable.

Incidentally, the increase of transmission speed leads to generation of noise even with microscopic deviation of differential signals between signal lines. A solution to this problem is a proposal on a transmission circuit that reduces the noise by insertion of a common mode choke coil in an interface such as a cable (e.g., reference is made to Japanese Patent Application Laid-Open No. 2001-85118).

SUMMARY OF THE INVENTION

In the case of the high-speed interfaces such as HDMI, the structure of IC itself becomes more susceptible to ESD (Electrostatic Discharge), in order to realize the increase of speed. For this reason, there are increasing demands for countermeasures against ESD in the high-speed transmission type ICs, and capacitive elements such as varistors and Zener diodes are used as ESD-prevention components.

However, insertion of capacitive elements as ESD-prevention components in the transmission lines was found to cause a new problem that signals through the transmission lines, particularly, high-frequency (200 MHz or higher) or high-speed pulse signals were reflected and attenuated. This results from the fact that with insertion of the capacitive elements in the transmission lines, the capacitance of the capacitive elements lowers the characteristic impedance at the position of insertion of the capacitive elements in the transmission lines so as to cause an impedance mismatch at the position. The existence of the impedance-mismatched portion in the transmission lines leads to reflection of high-frequency components of signals at the characteristic impedance-mismatched portion and, in turn, to occurrence of return loss. This results in heavily attenuating the signals. In addition, the reflection can induce unwanted radiation in the transmission lines, so as to cause noise.

For the HDMI, specified values of the characteristic impedance of the transmission lines (TDR standard) are defined as 100 Ω±15% (High-Definition Multimedia Interface Specification Version 1.1).

An object of the present invention is to provide a signal transmission circuit, an electronic device, a cable, and a connector capable of suppressing the reduction of the characteristic impedance even with use of capacitive elements as ESD-prevention components.

A signal transmission circuit according to the present invention comprises first and second inductors magnetically coupled to each other; a first capacitive element located posterior to the first inductor and electrically connected to the first inductor and to ground; a second capacitive element located posterior to the second inductor and electrically connected to the second inductor and to ground; a third inductor located between the first inductor and the first capacitive element and electrically connected to the first inductor; and a fourth inductor located between the second inductor and the second capacitive element and electrically connected to the second inductor.

In the signal transmission circuit according to the present Invention, the first to fourth inductors suppress the reduction of the characteristic impedance due to the first and second capacitive elements.

Preferably, the signal transmission circuit further comprises a fifth inductor located posterior to the first capacitive element and electrically connected to the third inductor; and a sixth inductor located posterior to the second capacitive element and electrically connected to the fourth inductor. This configuration is able to further suppress the reduction of the characteristic impedance due to the. first and second capacitive elements.

An electronic device, a cable, and a connector according to the present invention comprise the foregoing signal transmission circuit.

Each of the electronic device, cable, and connector according to the present invention is able to suppress the reduction of the characteristic impedance due to the first and second capacitive elements, as described above.

The present invention successfully provides the signal transmission circuit, electronic device, cable, and connector capable of suppressing the reduction of the characteristic impedance even with use of the capacitive elements as ESD-prevention components.

The present invention will become more fully understood from the detailed description given herein below and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiments of the present invention will be described below in detail with reference to the accompanying drawings. Identical elements or elements with identical functionality will be denoted by the same reference symbols in the description, without redundant description.

Figure 1:
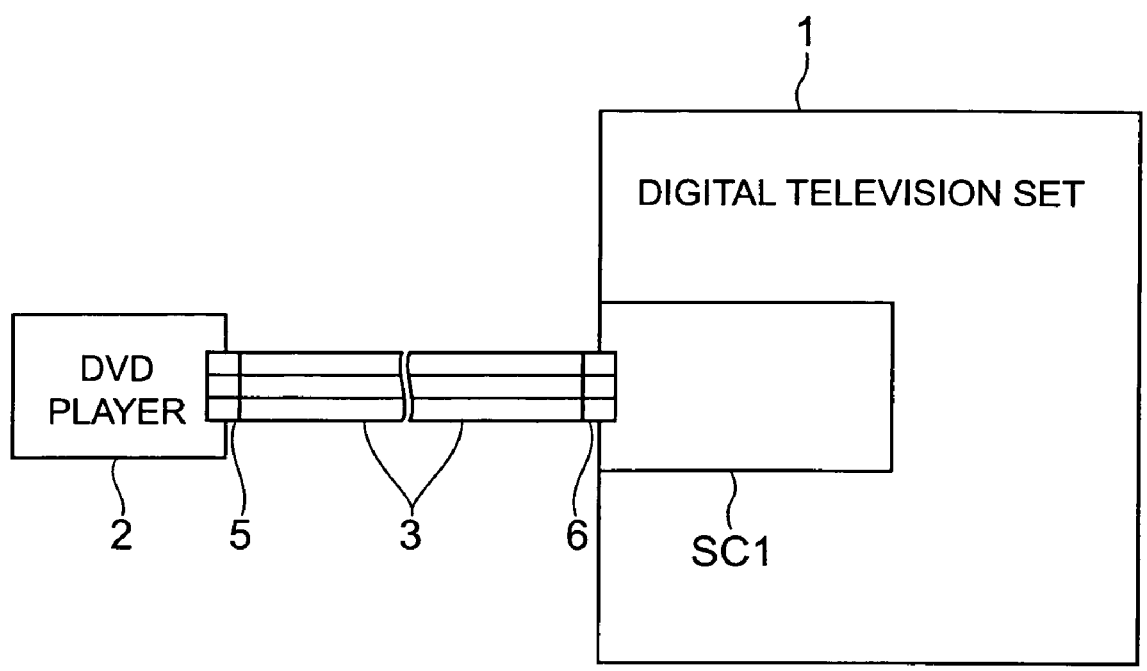
FIG. 1 is a schematic diagram showing a signal transmission circuit according to the first embodiment.

As shown in FIG. 1, a digital television set 1 and a DVD player 2 are connected through HDMI cable 3. The HDMI cable 3 is a cable using the differential transmission system and is equipped with joining terminal parts 5, 6 (connectors). The joining terminal part 5 of HDMI cable 3 is connected to an output part of DVD player 2. The joining terminal part 6 of HDMI cable 3 is connected to an input part of the digital television set 1. Digital signals fed out of the DVD player 2 are transmitted at high speed through the HDMI cable 3 to the digital television set 1.

Figure 2:
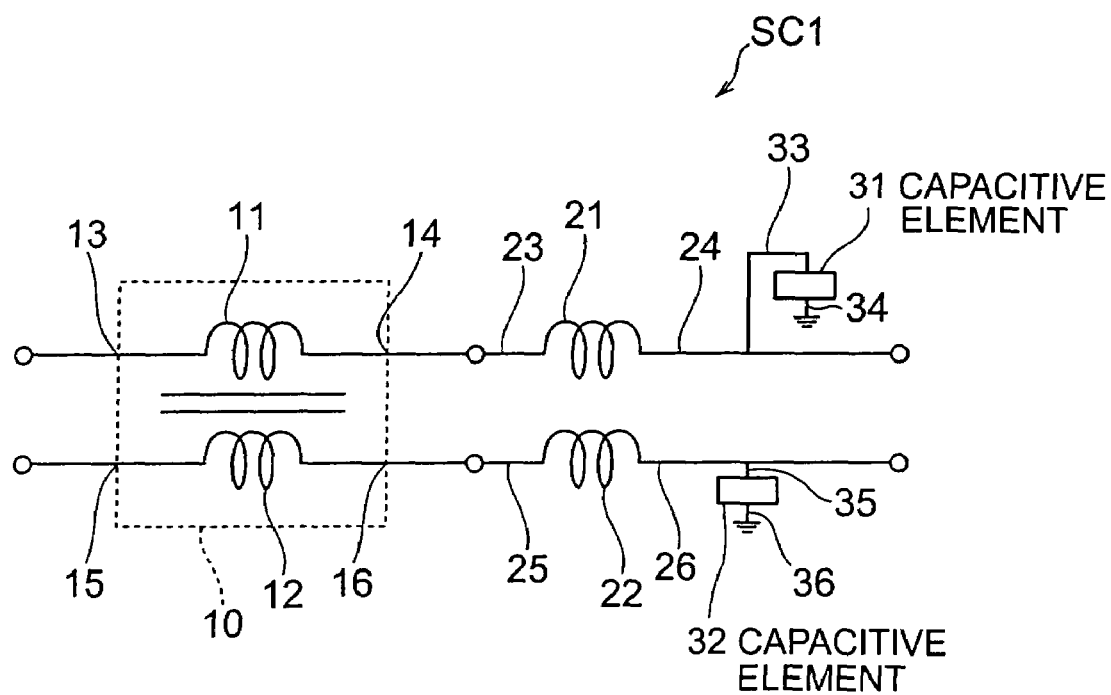
FIG. 2 is a circuit diagram showing the signal transmission circuit according to the first embodiment.

The digital television set 1 is equipped with a signal transmission circuit SC1 in the input part thereof. The signal transmission circuit SC1, as shown in FIG. 2, is provided with a common mode filter 10 having first and second inductors 11, 12 magnetically coupled to each other, third and fourth inductors 21, 22, and first and second varistors 31, 32. The common mode filter 10 has input/output terminals 13, 14 connected to the first inductor 11, and input/output terminals 15, 16 connected to the second inductor 12. When the joining terminal part 6 of the HDMI cable 3 is connected to the input part of the digital television set 1, the input terminals 13, 15 of the common mode filter 10 are connected to corresponding terminals of the joining terminal part 6.

Figure 3:
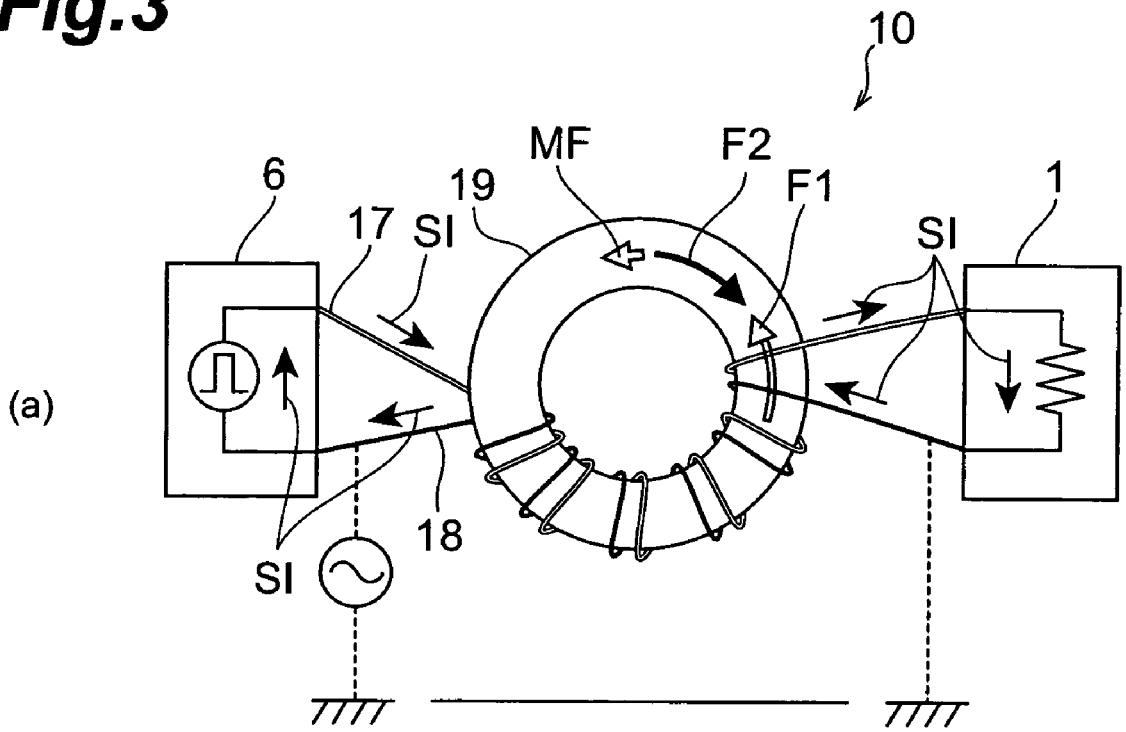
FIGS. 3a and 3b are schematic diagram to illustrate an operation of a common mode filter.
Figure 3:
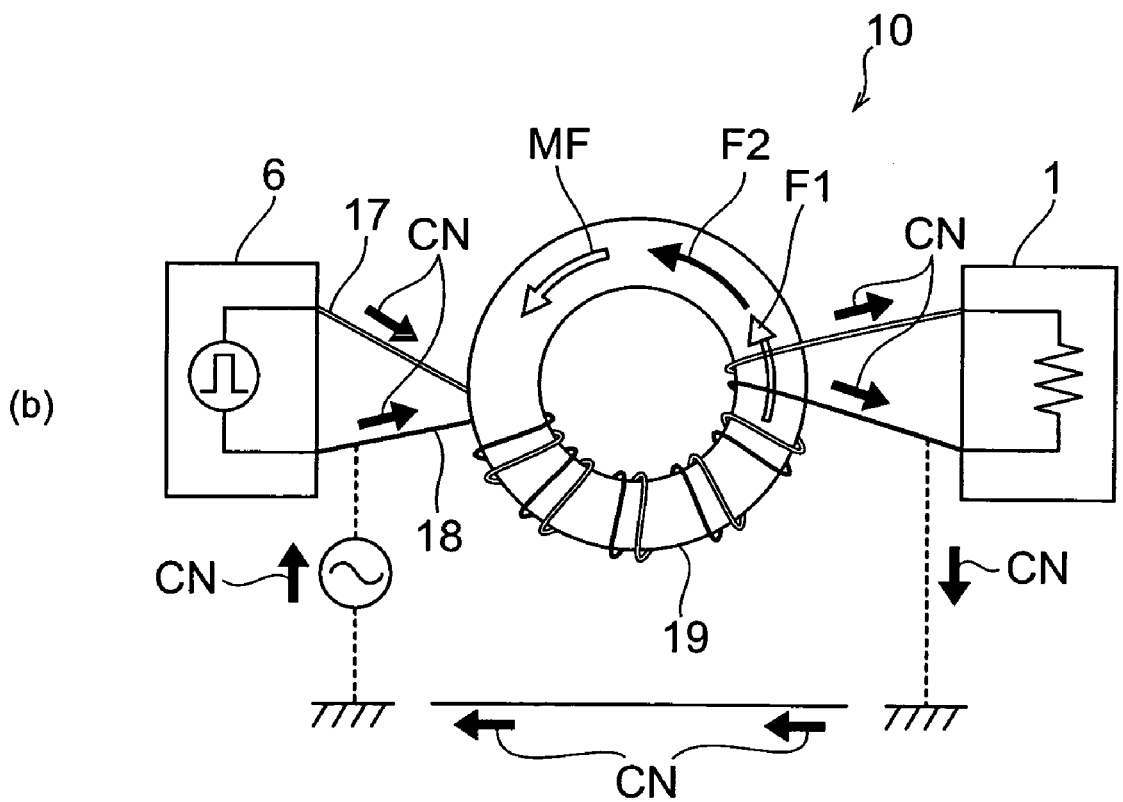

The structure and operation of the common mode filter 10 will be described below with reference to FIGS. 3a and 3b. FIGS. 3a and 3b are schematic diagrams to illustrate the operation of the common mode filter.

The common mode filter 10 is constructed in a configuration wherein two conductors 17, 18 electrically isolated from each other are wound by several turns on a ferrite core 19. The conductor 17 constitutes the first inductor 11, and the conductor 18 the second inductor 12. The shape of the ferrite core 19 does not always have to be limited to the ring shape as illustrated.

In the present embodiment, the common mode filter 10 is used in the differential mode for signals. In the differential mode, as shown in FIG. 3a, signals SI are fed as mutually opposite signals into the conductors 17, 18. For this reason, magnetic fluxes F1, F2 induced in the ferrite core 19 by the respective conductors 17, 18 are mutually opposite ones and act so as to cancel each other. Therefore, there is little impedance (inductance) due to a magnetic field MF made by the conductors 17, 18, and the signals SI are outputted with little attenuation.

On the other hand, the common mode filter 10 is used in the common mode, for common mode noise CN. In the common mode, as shown in FIG. 3b, common mode noise CN appears in the same direction of the conductors 17, 18. For this reason, magnetic fluxes F1, F2 induced in the ferrite core 19 by the respective conductors 17, 18 are those in the same direction and act so as to reinforce each other. Therefore, the impedance (inductance) due to the magnetic field MF made by the conductors 17, 18 is high, so that little common mode noise CN is outputted. In this manner, the common mode filter 10 is able to attenuate the noise.

Reference is made again to FIG. 2. The third inductor 21 has input/output terminals 23, 24. The input terminal 23 of the third inductor 21 is connected to the output terminal 14 of the common mode filter 10. The third inductor 21 is electrically connected to the first inductor 11. The third inductor 21 is substantially not magnetically coupled to the first inductor 11. The first varistor 31 has input/output terminals 33, 34. The input terminal 33 of the first varistor 31 is connected to the output terminal 24 of the third inductor 21. The output terminal 34 of the first varistor 31 is connected to the ground potential. In this configuration, the first varistor 31 is located posterior to the first inductor 11 and the third inductor 21 and is electrically connected to the first inductor 11 and third inductor 21. The third inductor 21 is located between the first inductor 11 and the first varistor 31.

The fourth inductor 22 has input/output terminals 25, 26. The input terminal 25 of the fourth inductor 22 is connected to the output terminal 16 of the common mode filter 10. The fourth inductor 22 is electrically connected to the second inductor 12. The fourth inductor 22 is substantially not magnetically coupled to the second inductor 12. The second varistor 32 has input/output terminals 35, 36. The input terminal 35 of the second varistor 32 is connected to the output terminal 26 of the fourth inductor 22. The output terminal 36 of the second varistor 32 is connected to the ground potential. In this configuration, the second varistor 32 is located posterior to the second inductor 12 and the fourth inductor 22 and is electrically connected to the second inductor 12 and the fourth inductor 22. The fourth inductor 22 is located between the second inductor 12 and the second varistor 32.

The common mode filter 10 can be, for example, one of the common mode filters in the ACM series available from TDK Corp. The first and second varistors 31, 32 can be, for example, multilayer chip varistors in the AVR series available from TDK Corp.

In the first embodiment, as described above, the common mode filter 10 (first and second inductors 11, 12) is inserted anterior to the first and second varistors 31, 32, and the third and fourth inductors 21, 22 are inserted each between the common mode filter 10 and the first and second varistors 31, 32. This enables the circuit to suppress the reduction of the characteristic impedance due to the first and second varistors 31, 32.

In the first embodiment the common mode filter 10 is inserted anterior to the first and second varistors 31, 32. This permits the signal from the DVD player 2 to be fed through the HDMI cable 3 and signal transmission circuit SC1 to the digital television set 1, with little external noise.

Figure 4:
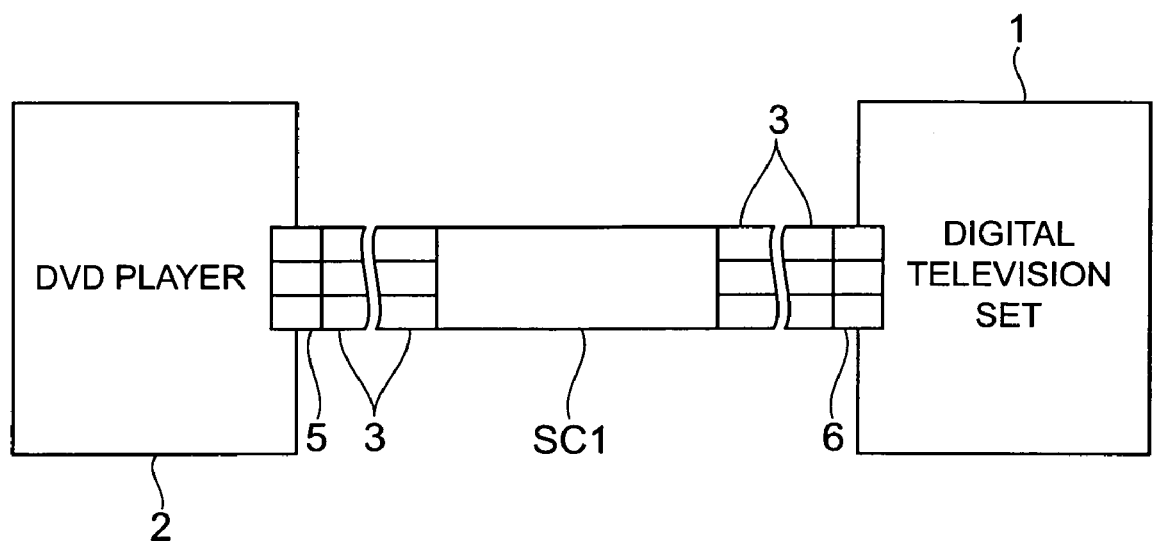
FIG. 4 is a schematic diagram showing a modification example of the signal transmission circuit according to the first embodiment.
Figure 5:
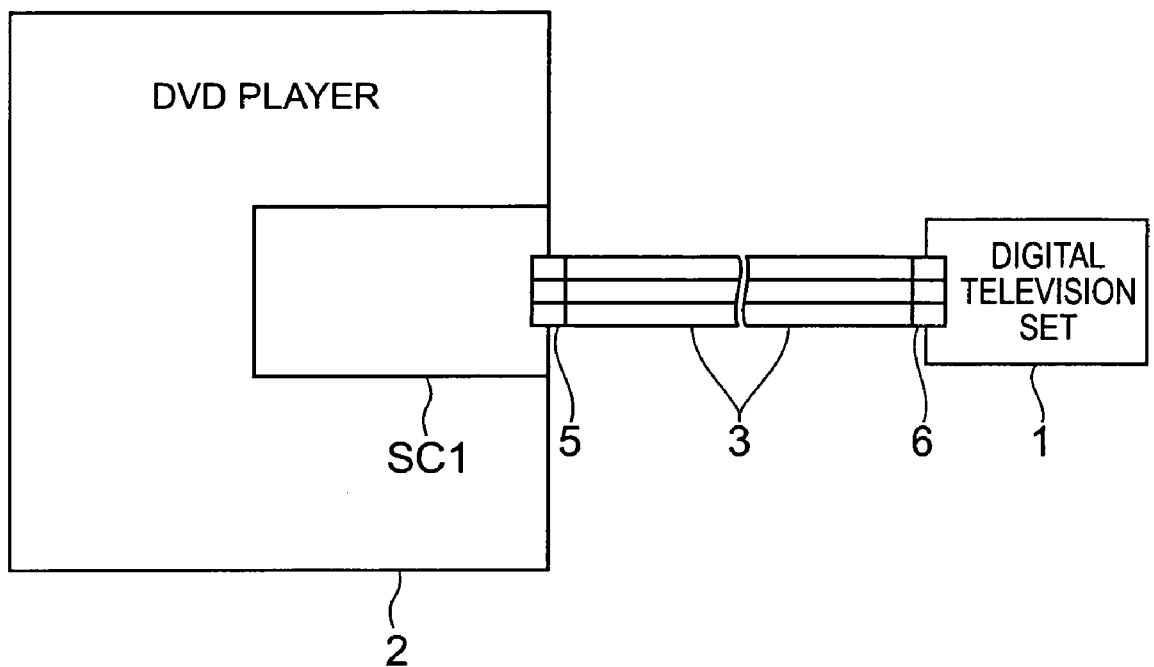
FIG. 5 is a schematic diagram showing another modification example of the signal transmission circuit according to the first embodiment.
Figure 6:
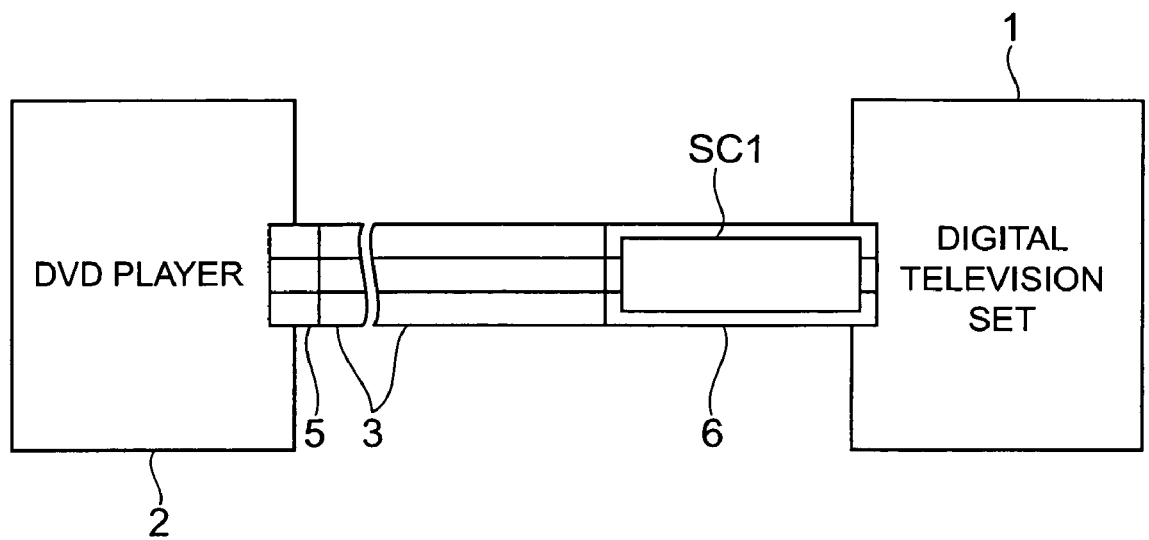
FIG. 6 is a schematic diagram showing still another modification example of the signal transmission circuit according to the first embodiment.

Next, configurations in modification examples of the signal transmission circuit SC1 according to the first embodiment will be described on the basis of FIGS. 4 to 6. FIGS. 4 to 6 are illustrations showing the modification examples of the signal transmission circuit according to the first embodiment.

In the modification example shown in FIG. 4, the HDMI cable 3 is provided with the signal transmission circuit SC1.

In the modification example shown in FIG. 5, the DVD player 2 is provided with the signal transmission circuit SC1 in the output part thereof.

In the modification example shown in FIG. 6, the joining terminal part 6 (connector) of the HDMI cable 3 is provided with the signal transmission circuit SC1. Instead of the configuration wherein the joining terminal part 6 of the HDMI cable 3 is provided with the signal transmission circuit SC1, the joining terminal part 5 (connector) of the HDMI cable 3 may be provided with the signal transmission circuit SC1.

In all the modification examples shown in FIGS. 4 to 6, the circuit is able to suppress the reduction of the characteristic impedance due to the first and second varistors 31, 32.

Second Embodiment

Figure 7:
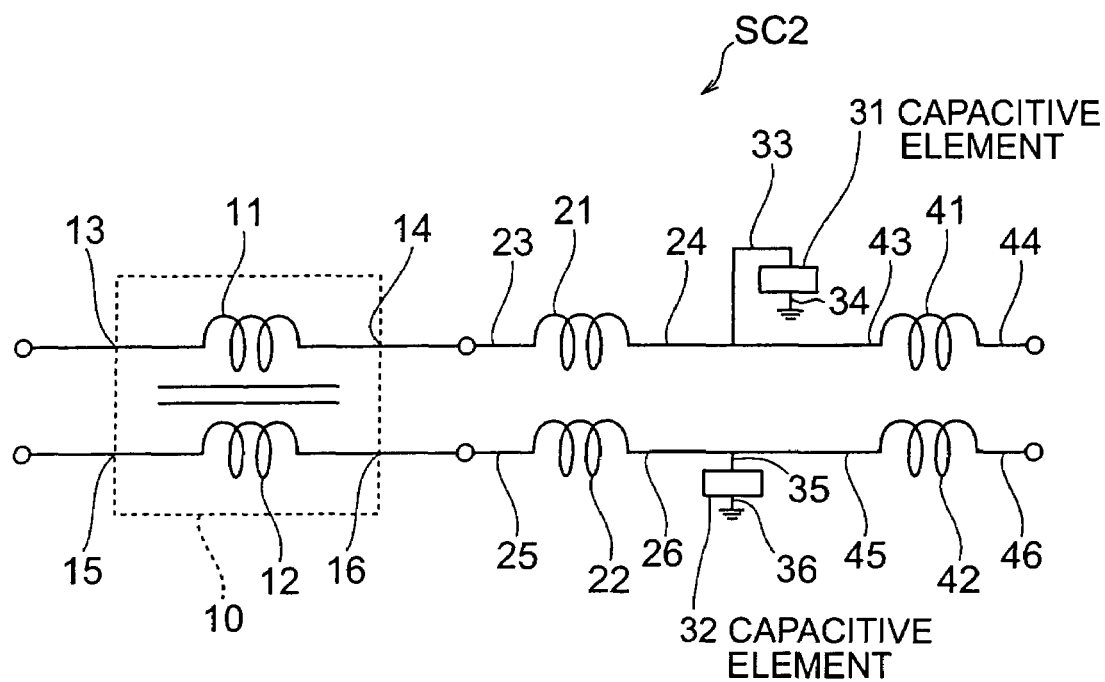
FIG. 7 is a circuit diagram showing a signal transmission circuit according to the second embodiment.

Next, a configuration of a signal transmission circuit according to the second embodiment will be described on the basis of FIG. 7. FIG. 7 is a circuit diagram showing the signal transmission circuit according to the second embodiment.

The digital television set 1 is equipped with the signal transmission circuit SC2 in the input part thereof, as in the first embodiment. The signal transmission circuit SC2, as shown in FIG. 7, is comprised of a common mode filter 10, third and fourth inductors 21, 22, first and second varistors 31, 32, and fifth and sixth inductors 41, 42.

The fifth inductor 41 has input/output terminals 43, 44. The input terminal 43 of the fifth inductor 41 is connected to the output terminal 24 of the third inductor 21. The fifth inductor 41 is electrically connected to the first inductor 11 and third inductor 21. In this configuration, the fifth inductor 41 is located posterior to the first varistor 31.

The sixth inductor 42 has input/output terminals 45, 46. The input terminal 45 of the sixth inductor 42 is connected to the output terminal 26 of the fourth inductor 22. The sixth inductor 42 is electrically connected to the second inductor 12 and fourth inductor 22. In this configuration, the sixth inductor 42 is located posterior to the second varistor 32.

In the second embodiment, as described above, the fifth and sixth inductors 41, 42 are inserted posterior to the first and second varistors 31, 32, respectively. This permits the circuit to further suppress the reduction of the characteristic impedance due to the first and second varistors 31, 32.

The signal transmission circuit SC2 may be provided in the HDMI cable 3, in the DVD player 2, or in the joining terminal part 5 or 6 (connector), as shown in FIGS. 4 to 6. In this case, it is also feasible to further suppress the reduction of the characteristic impedance due to the first and second varistors 31, 32.

The following will describe by specific examples that the first and second embodiments are able to suppress the reduction of the characteristic impedance due to the first and second varistors. The characteristic impedance of the signal transmission circuit herein is measured by the TDR (Time Domain Reflectometry) method. The TDR method is a measurement method of feeding a step pulse onto a transmission line, and measuring a pulse reflected at a discontinuity of the characteristic impedance, thereby measuring the characteristic impedance of the transmission line.

Figure 8:
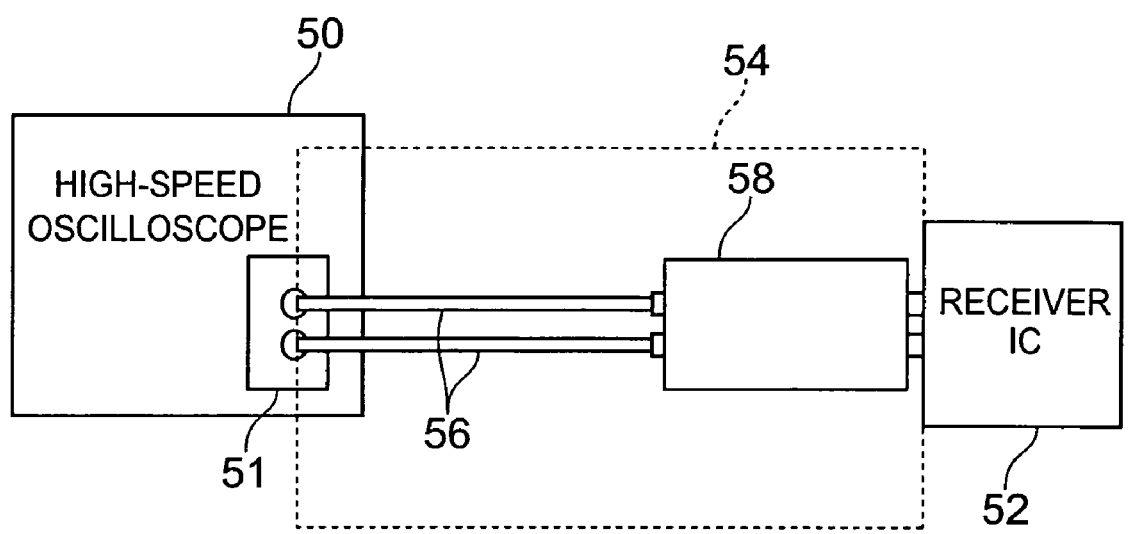
FIG. 8 is an illustration for explaining a measurement environment by the TDR method.

First, the measurement environment by the TDR method will be described on the basis of FIG. 8. In each measurement environment shown in FIG. 8, a high-speed oscilloscope 50 and a receiver IC 52 are connected through a transmission channel 54. The transmission channel 54 has a coaxial cable 56 and a signal transmission circuit 58. The high-speed oscilloscope 50 has a TDR module 51. The high-speed oscilloscope 50 is connected through the TDR module 51 with the coaxial cable 56, and the other end of the coaxial cable 56 is connected to the signal transmission circuit 58. The receiver IC 52 is connected to the other end of the signal transmission circuit 58.

The high-speed oscilloscope 50 used herein is Agilent 86100: wide-bandwidth oscilloscope available from Agilent Technologies, Inc. The TDR module 51 used herein is the 54754 differential TDR plug-in module available from Agilent Technologies, Inc. The receiver IC 52 has the infinitely large input impedance with power off, and reflects 100% of the signal from the high-speed oscilloscope 50. The coaxial cable 56 consists of two differential signal lines and each signal line has the characteristic impedance of 50 Ω. For this reason, the total characteristic impedance of the coaxial cable 56 is 100 Ω.

Figure 9:
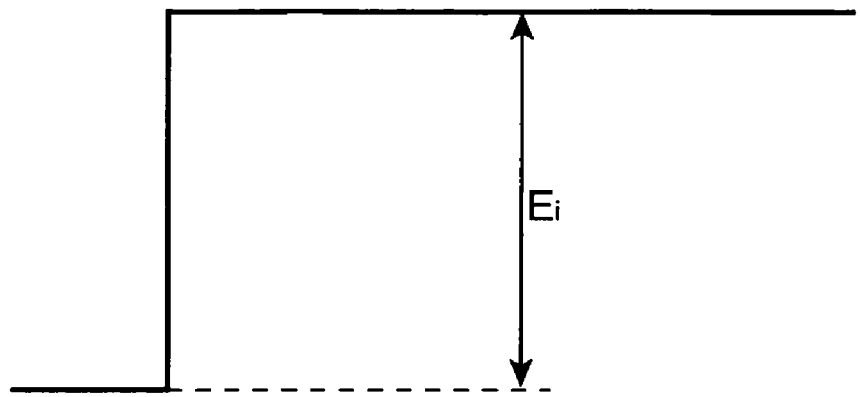
FIG. 9 is an illustration for explaining a measurement method by the TDR method.
Figure 9:
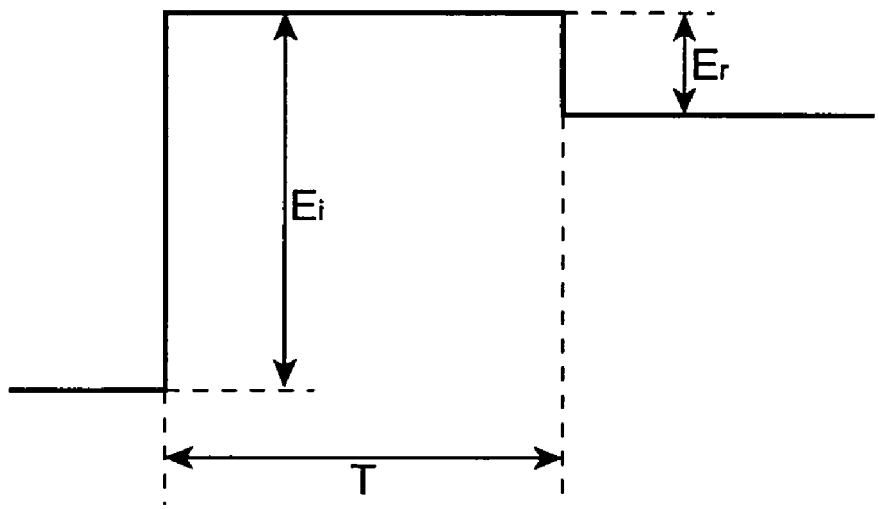

Next, the measurement method by the TDR method will be described on the basis of FIGS. 8 and 9. First, the high-speed oscilloscope 50 generates an input voltage step Ei and outputs this input voltage step Ei to the transmission channel 54. Where there is no discontinuity of characteristic impedance on the transmission channel 54, the input voltage step Ei is reflected by the receiver IC 52 as it is. In this case, the high-speed oscilloscope 50 displays only the input voltage step Ei, as shown in (a) in FIG. 9. On the other hand, where there is a discontinuity of characteristic impedance on the transmission channel 54, part of the input voltage step is reflected at the discontinuity. In this case, the high-speed oscilloscope 50 displays a reflected wave Er algebraically added to the input voltage step Ei, as shown in (b) in FIG. 9. We can determine the position of the discontinuity of characteristic impedance and the value of the characteristic impedance from this result. Specifically, the position of the discontinuity of characteristic impedance can be determined based on a time T up to the measurement of the reflected wave Er and the characteristic impedance at the discontinuity can be determined based on the value of the reflected wave Er.

The common mode filter used herein was ACM2012D-900 (available from TDK Corp.). The characteristic impedance of ACM2012D-900 is 100 Ω. The cutoff frequency of ACM2012D-900 is 3.5 GHz. The first and second varistors used herein were AVR161A1R1 (available from TDK Corp.). The capacitance of AVR161A1R1 is 1.1 pF. The third to sixth inductors used herein were the MLK1005 series (available from TDK Corp.).

Figure 10:
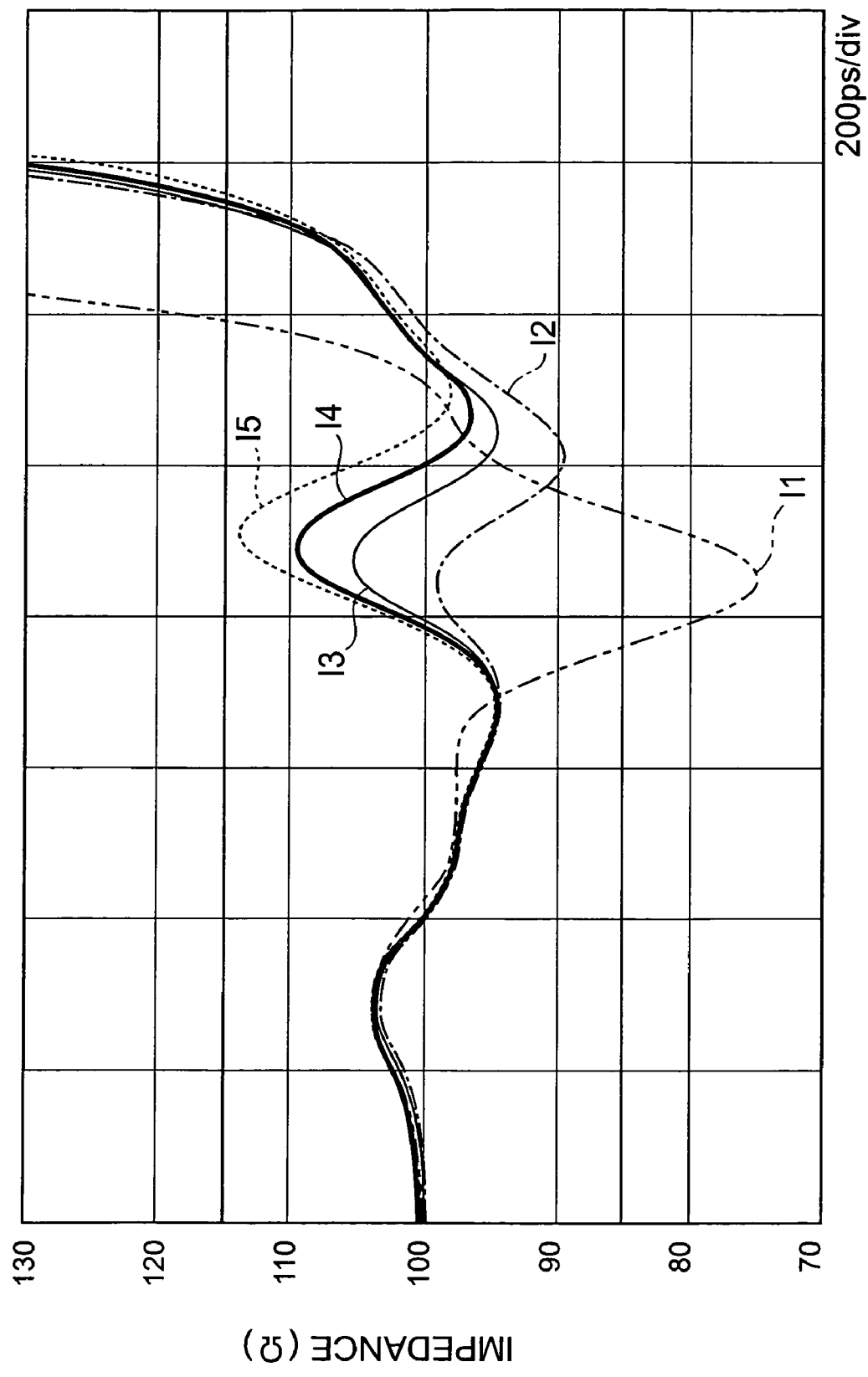
FIG. 10 is a graph showing the measurement results by the TDR method.
Figure 11:
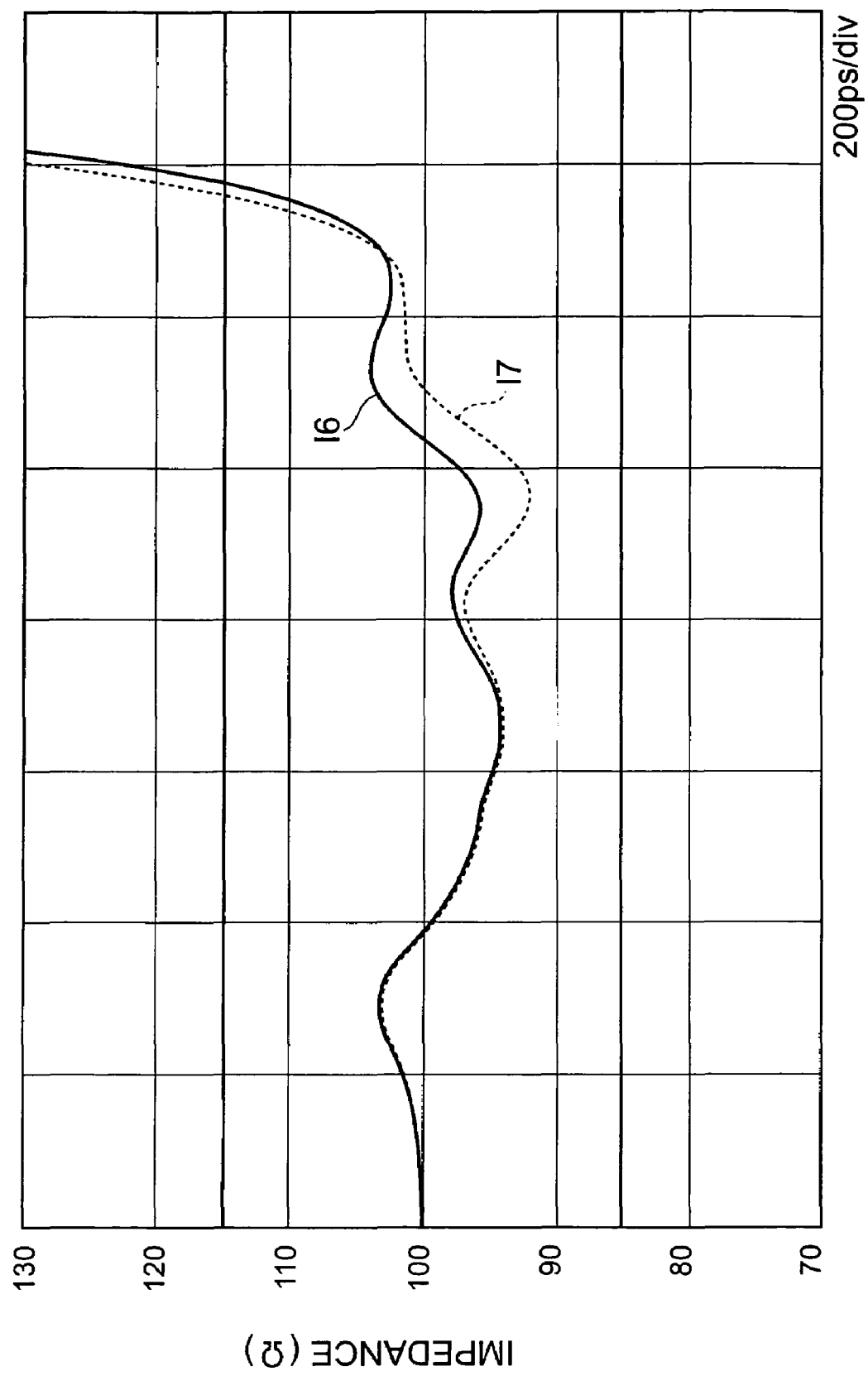
FIG. 11 is a graph showing the measurement results by the TDR method.
Figure 12:
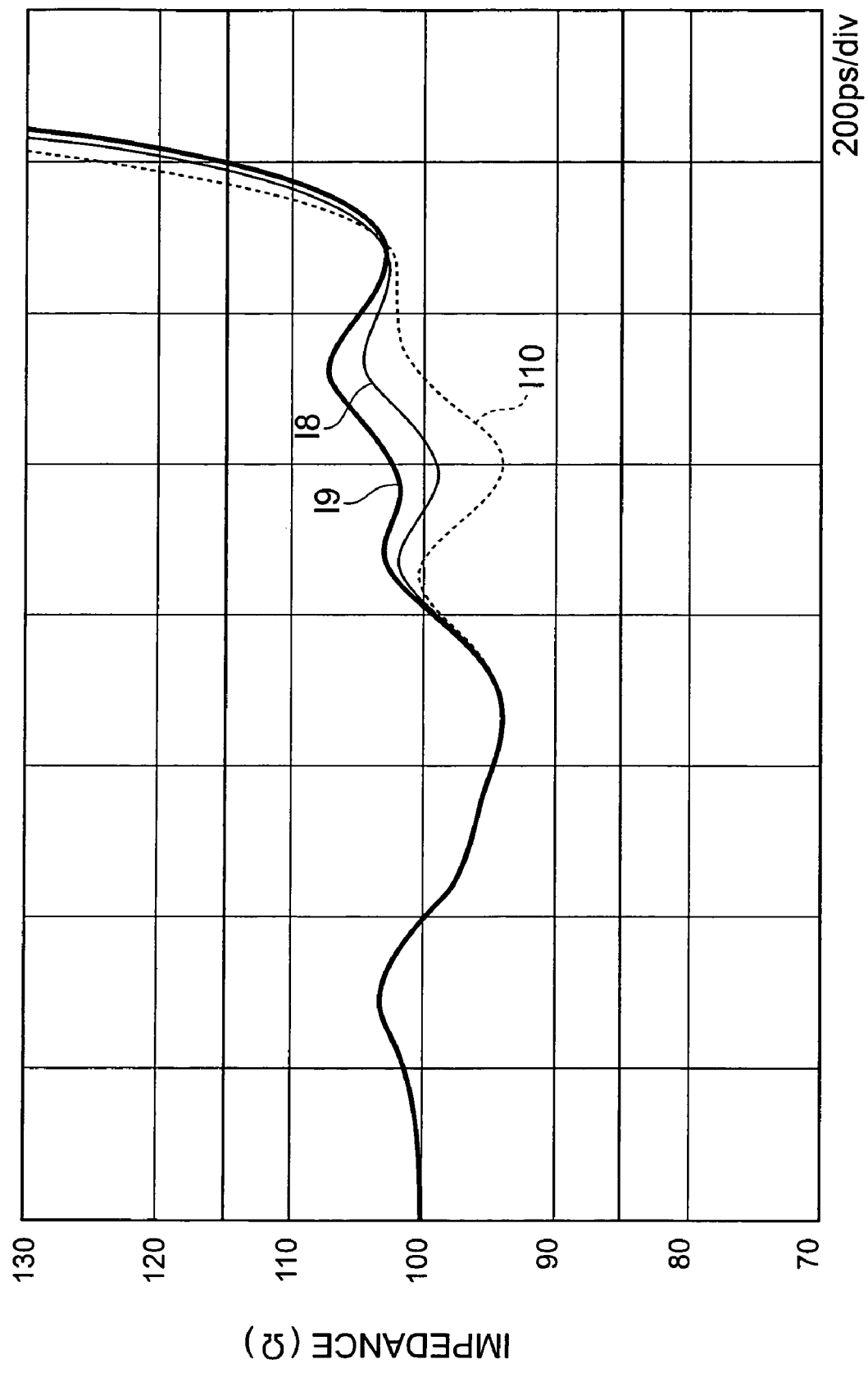
FIG. 12 is a graph showing the measurement results by the TDR method.

The measurement results are shown in FIGS. 10 to 12.

Reference is made to FIG. 10. Characteristic I1 represents the measurement result in a case where the signal transmission circuit 58 has the first and second varistors but has none of the common mode filter and the third to sixth inductors. It is seen from the characteristic I1 that the characteristic impedance is lowered by influence of the first and second varistors, so as to cause an impedance mismatch.

Characteristic I2 represents the measurement result in a case where the signal transmission circuit 58 has the first and second varistors and the common mode filter but has none of the third to sixth inductors. The signal transmission circuit 58 was so constructed that the separation on the transmission lines between the output terminals of the common mode filter and the input terminals of the first and second varistors, i.e., the temporal length between the output terminals of the common mode filter and the input terminals of the first and second varistors was set to 23 ps.

It is seen from the characteristic I2 that the characteristic impedance of the signal transmission circuit 58 is within the range of 100 Ω±15% but the characteristic impedance remains lowered due to the influence of the first and second varistors.

Characteristics I3-I5 represent the measurement results in cases where the signal transmission circuit 58 has the first and second varistors, the common mode filter, and the third and fourth inductors, i.e., where the signal transmission circuit 58 has the same configuration as the signal transmission circuit SC1 of the first embodiment described above. The characteristic I3 represents the measurement result in the case where the inductances of the third and fourth inductors are 1.0 nH. The characteristic I4 represents the measurement result in the case where the inductances of the third and fourth inductors are 1.5 nH. The characteristic I5 represents the measurement result in the case where the inductances of the third and fourth inductors are 2.2 nH. The signal transmission circuit 58 was so constructed that the separation on the transmissions lines between the output terminals of the common mode filter and the input terminals of the third and fourth inductors, i.e., the temporal length between the output terminals of the common mode filter and the input terminals of the third and fourth inductors was set to 20 ps. Likewise, the separation on the transmission lines between the output terminals of the third and fourth inductors and the input terminals of the first and second varistors, i.e., the temporal length between the output terminals of the third and fourth inductors and the input terminals of the first and second varistors was set to 0 ps.

It is seen from the characteristics I3-I5 that the reduction of the characteristic impedance due to the first and second varistors is suppressed well.

It is seen from the characteristic I5 that, where the inductances of the third and fourth inductors are 2.2 nH, the characteristic impedance is lowered at the position of the first and second varistors, but the characteristic impedance becomes increased in another region. The appearance of the region with high characteristic impedance is conceivably attributable to the inductances of the third and fourth inductors. Therefore, the inductances of the third and fourth inductors are preferably in the range of 1 to 2 nH.

Next, reference is made to FIG. 11. Characteristic I6 and characteristic I7 represent the measurement results in cases where the signal transmission circuit 58 has the first and second varistors, the common mode filter, and the third to sixth inductors, i.e., where the signal transmission circuit 58 has the same configuration as the signal transmission circuit SC2 of the second embodiment described above. The characteristic I6 represents the measurement result in the case where the inductances of the third to sixth inductors are 1.0 nH. The characteristic I7 represents the measurement result in the case where the inductances of the third and fourth inductors are 1.0 nH and where the fifth and sixth inductors are bypassed. The signal transmission circuit 58 was so constructed that the separation on the transmission lines between the output terminals of the common mode filter and the input terminals of the third and fourth inductors, i.e., the temporal length between the output terminals of the common mode filter and the input terminals of the third and fourth inductors was set to 0 ps. Likewise, the separation on the transmission lines between the output terminals of the third and fourth inductors and the input terminals of the first and second varistors, i.e., the temporal length between the output terminals of the third and fourth inductors and the input terminals of the first and second varistors was set to 0 ps. In the same manner, the separation on the transmission lines between the input terminals of the first and second varistors and the input terminals of the fifth and sixth inductors, i.e., the temporal length between the input terminals of the first and second varistors and the input terminals of the fifth and sixth inductors was set to 0 ps.

It is seen from the characteristic I6 that the reduction of the characteristic impedance due to the first and second varistors is more suppressed.

Next, reference is made to FIG. 12. Characteristics I8-I10 represent the measurement results in cases where the signal transmission circuit 58 has the first and second varistors, the common mode filter, and the third to sixth inductors, i.e., where the signal transmission circuit 58 has the same configuration as the signal transmission circuit SC2 of the second embodiment described above. The characteristic I8 represents the measurement result in the case where the inductances of the third and fourth inductors are 1.5 nH and where the inductances of the fifth and sixth inductors are 1.0 nH. The characteristic I9 represents the measurement result in the case where the inductances of the third to sixth inductors are 1.5 nH. The characteristic I10 represents the measurement result in the case where the inductances of the third and fourth inductors are 1.5 nH and where the fifth and sixth inductors are bypassed. The signal transmission circuit 58 was so constructed that the separation on the transmission lines between the output terminals of the common mode filter and the input terminals of the third and fourth inductors, i.e., the temporal length between the output terminals of the common mode filter and the input terminals of the third and fourth inductors was set to 0 ps. Likewise, the separation on the transmission lines between the output terminals of the third and fourth inductors and the input terminals of the first and second varistors, i.e., the temporal length between the output terminals of the third and fourth inductors and the input terminals of the first and second varistors was set to 0 ps. In the same manner, the separation on the transmission lines between the input terminals of the first and second varistors and the input terminals of the fifth and sixth inductors, i.e., the temporal length between the input terminals of the first and second varistors and the input terminals of the fifth and sixth inductors was set to 0 ps.

It is seen from the characteristics I8 and I9 that the reduction of the characteristic impedance due to the first and second varistors is more suppressed.

The above confirmed the usefulness of the first and second embodiments.

As apparent from the above measurement results, the inductances of the third to sixth inductors are preferably smaller than 10 nH and more preferably in the range of 1-2 nH. This is because the inductances of the third to sixth inductors can produce a region with high characteristic impedance, so as to make the impedance matching insufficient.

The separation on the transmission lines between the output terminals of the common mode filter and the input terminals of the third and fourth inductors, the separation on the transmission lines between the output terminals of the third and fourth inductors and the input terminals of the first and second varistors, and the separation on the transmission lines between the input terminals of the first and second varistors and the input terminals of the fifth and sixth inductors are preferably as short as possible. The reason for it is that the transmission lines between terminals (e.g., conductor patterns on a substrate) have their respective inductances and capacitances and that these inductances and capacitances can be factors to impede the impedance matching.

Where the common mode filter is used as a noise filter, a capacitor is connected between the signal lines in certain cases (e.g., reference is made to Japanese Patent Application Laid-Open No. 2004-40444). However, if a capacitor is connected between the signal lines in the first and second embodiments, an unwanted capacitance will be made, so as to fail to achieve impedance matching. Therefore, the first and second embodiments are provided without the capacitor between the signal lines.

The preferred embodiments of the present invention were described above, but it is noted that the present invention is not always limited to these embodiments. For example, the signal transmission circuit SC1, SC2 does not always have to be located at the positions described above, but may be located anywhere after the output from the DVD player 2 and before the first circuit of the digital television set 1. The DVD player 2 may be another source device such as a personal computer or a set-top box. The HDMI cable 3 may be a cable compliant with the standards such as DVI, USB, or IEEE. The digital television set 1 may be another sink device such as an LCD monitor or a projector.

The first and second embodiments employed the varistors as the first and second capacitive elements, but the first and second capacitive elements may be other capacitive elements such as Zener diodes.

The common mode filter 10 may be any other filter than the wound common mode filter in which two conductors electrically isolated from each other are wound by several turns on the ferrite core; for example, it may be a multilayer common mode filter, a multilayer common mode filter with conductor patterns formed by thin-film forming technology, or the like.

In a case where the input/output terminals of the common mode filter 10 are constructed of terminal electrodes of metal, the terminal electrodes may be used as the third and fourth inductors 21, 22. In this case, it is necessary to set the size of the terminal electrodes (e.g., the electrode width or the like) so as to achieve the aforementioned impedances.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An electronic device unit comprising:
   a source device having a signal transmission circuit;
   a sink device;
   and a High-Definition Multimedia Interface cable having a first connector connected to an output of the source device and a second connector connected to an input of the sink device;
   wherein the signal transmission circuit has a first transmission line connected to one terminal of the first connector, a second transmission line connected to another terminal of the first connector, a first capacitive element connected between the first transmission line and a ground potential, a second capacitive element connected between the second transmission line and the ground potential, a first inductor connected in series to the first transmission line, and a second inductor connected in series to the second transmission line, the first and second inductors are magnetically coupled to each other,
   and a characteristic impedance of the signal transmission circuit is in a range of 100-+15%.

2. The electronic device unit according to claim 1, wherein the first capacitive element and second capacitive element are varistors.

3. The electronic device unit according to claim 1, wherein the signal transmission circuit further comprises:
   a third inductor located between the first inductor and a first connection portion between the first transmission line and the first capacitive element and connected in series to the first inductor, and
   a fourth inductor located between the second inductor and a second connection portion between the second transmission line and the second capacitive element and connected in series to the second inductor.

4. The electronic device unit according to claim 3, wherein an inductance of the third inductor and fourth inductor is in a range of 1-2 nH.

5. The electronic device unit according to claim 3, wherein:
   a temporal length between an output terminal of the first inductor and an input terminal of the third inductor is set to 20 ps,
   a temporal length between an output terminal of the second inductor and an input terminal of the fourth inductor is set to 20 ps,
   a temporal length between an output terminal of the third inductor and an input terminal of the first capacitive element is set to 0 ps, and
   a temporal length between an output terminal of the fourth inductor and an input terminal of the second capacitive element is set to 0 ps.

6. The electronic device unit according to claim 3, wherein the signal transmission circuit further comprises:
   a fifth inductor located between the first connection portion and one terminal of the second connector and connected in series to the third inductor, and
   a sixth inductor located between the second connection portion and another terminal of the second connector and connected in series to the fourth inductor.

7. The electronic device unit according to claim 6, wherein an inductance of the fifth inductor and sixth inductor is in a range of 1-2 nH.

8. The electronic device unit according to claim 6, wherein:
   a temporal length between an output terminal of the first inductor and an input terminal of the third inductor is set to 0 ps,
   a temporal length between an output terminal of the second inductor and an input terminal of the fourth inductor is set to 0 ps,
   a temporal length between an output terminal of the third inductor and an input terminal of the first capacitive element is set to 0 ps,
   a temporal length between an output terminal of the fourth inductor and an input terminal of the second capacitive element is set to 0 ps,
   a temporal length between an output terminal of the first capacitive element and an input terminal of the fifth inductor is set to 0 ps, and
   a temporal length between an output terminal of the second capacitive element and an input terminal of the sixth inductor is set to 0 ps.

9. The electronic device unit according to claim 1, wherein the source device is a DVD player, and the sink device is a digital television set.

10. An electronic device unit comprising:

a source device;

a sink device having a signal transmission circuit; and a High-Definition Multimedia Interface cable having a first connector connected to an output of the source device and a second connector connected to an input of the sink device;

wherein the signal transmission circuit has a first inductor connected to one terminal of the second connector, a second inductor connected to another terminal of the second connector, a first transmission line connected in series to the first inductor, a second transmission line connected in series to the second inductor, a first capacitive element connected between the first transmission line and a ground potential, and a second capacitive element connected between the second transmission line and a ground potential, the first and second inductors are magnetically coupled to each other, and a characteristic impedance of the signal transmission circuit is in a range of 100 Ω±15%.

11. The electronic device unit according to claim 10, wherein the first capacitive element and second capacitive element are varistors.

12. The electronic device unit according to claim 10, wherein the signal transmission circuit further comprises:

a third inductor located between the first inductor and a first connection portion between the first transmission line and the first capacitive element and connected in series to the first inductor, and a fourth inductor located between the second inductor and a second connection portion between the second transmission line and the second capacitive element and connected in series to the second inductor.

13. The electronic device unit according to claim 12, wherein an inductance of the third inductor and fourth inductor is in a range of 1-2 nH.

14. The electronic device unit according to claim 12, wherein:

a temporal length between an output terminal of the first inductor and an input terminal of the third inductor is set to 20 ps, a temporal length between an output terminal of the second inductor and an input terminal of the fourth inductor is set to 20 ps, a temporal length between an output terminal of the third inductor and an input terminal of the first capacitive element is set to 0 ps, and a temporal length between an output terminal of the fourth inductor and an input terminal of the second capacitive element is set to 0 ps.

15. The electronic device unit according to claim 12, wherein the signal transmission circuit further comprises:

a fifth inductor located between the first connection portion and one terminal of the second connector and connected in series to the third inductor, and a sixth inductor located between the second connection portion and another terminal of the first connector and connected in series to the fourth inductor.

16. The electronic device unit according to claim 15, wherein an inductance of the fifth inductor and sixth inductor is in a range of 1-2 nH.

17. The electronic device unit according to claim 15, wherein:

a temporal length between an output terminal of the first inductor and an input terminal of the third inductor is set to 0 ps, a temporal length between an output terminal of the second inductor and an input terminal of the fourth inductor is set to 0 ps, a temporal length between an output terminal of the third inductor and an input terminal of the first capacitive element is set to 0 ps, a temporal length between an output terminal of the fourth inductor and an input terminal of the second capacitive element is set to 0 ps, a temporal length between an output terminal of the first capacitive element and an input terminal of the fifth inductor is set to 0 ps, and a temporal length between an output terminal of the second capacitive element and an input terminal of the sixth inductor is set to 0 ps.

18. The electronic device unit according to claim 10, wherein the source device is a DVD player, and the sink device is a digital television set.

* * * * *